United States Patent
Nagano et al.

(10) Patent No.: US 12,270,837 B2
(45) Date of Patent: Apr. 8, 2025

(54) VOLTAGE DETECTION DEVICE

(71) Applicant: OMRON Corporation, Kyoto (JP)

(72) Inventors: Masaaki Nagano, Kyoto (JP); Kohei Tanino, Kyoto (JP); Kosuke Sumi, Kyoto (JP); Yohei Takashima, Kyoto (JP); Tomonori Watanabe, Kyoto (JP); Kosuke Yoshimaru, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 95 days.

(21) Appl. No.: 18/019,986

(22) PCT Filed: Mar. 8, 2021

(86) PCT No.: PCT/JP2021/009052
§ 371 (c)(1),
(2) Date: Feb. 6, 2023

(87) PCT Pub. No.: WO2022/059232
PCT Pub. Date: Mar. 24, 2022

(65) Prior Publication Data
US 2023/0314489 A1 Oct. 5, 2023

(30) Foreign Application Priority Data
Sep. 16, 2020 (JP) .................................. 2020-155367

(51) Int. Cl.
*G01R 19/32* (2006.01)

(52) U.S. Cl.
CPC .................................. *G01R 19/32* (2013.01)

(58) Field of Classification Search
CPC ...... G01R 15/12; G01R 15/144; G01R 19/00; G01R 19/30; G01R 21/06; G01R 31/261; G01R 31/2623
See application file for complete search history.

(56) References Cited

U.S. PATENT DOCUMENTS

2007/0040544 A1* 2/2007 Suzuki ................. G01R 15/144
324/72
2007/0103174 A1 5/2007 Tanaka
(Continued)

FOREIGN PATENT DOCUMENTS

CN 205301414 U 6/2016
CN 107167678 A 9/2017
(Continued)

OTHER PUBLICATIONS

JPO Notice of Reasons for Refusal issued in corresponding JP Application No. 2020-155367; mailed Jan. 30, 2024; 6 pages.
(Continued)

*Primary Examiner* — Tung X Nguyen
(74) *Attorney, Agent, or Firm* — CANTOR COLBURN LLP

(57) ABSTRACT

To provide voltage detection device capable of reducing variations and errors in detection voltage caused by influence of configuration of pattern wiring and temperature when detecting voltages applied to a plurality of resistance elements connected in parallel. Voltage detection device includes resistance unit including a plurality of resistance elements connected in parallel, differential amplifier circuit, first connection portion having two wiring portions connecting positions different from each other in one end portion of resistance unit and input terminal of differential amplifier circuit, and second connection portion having two wiring portion connecting positions different from each other in other end portion of resistance unit and input terminal of differential amplifier circuit. Voltage detection device configures to detect voltage applied to resistance unit based on voltage of output terminal of differential amplifier circuit.

3 Claims, 7 Drawing Sheets

(56) References Cited

U.S. PATENT DOCUMENTS

2014/0376282 A1    12/2014  Mine
2017/0292979 A1*   10/2017  Laird ........................ G06F 1/28

FOREIGN PATENT DOCUMENTS

| CN | 109188049 A | * | 1/2019 | ............ G01R 19/00 |
| JP | 2002191179 A |   | 7/2002 | |
| JP | 2009115745 A |   | 5/2009 | |
| JP | 2013255340 A |   | 12/2013 | |
| JP | 20154592 A |   | 1/2015 | |

OTHER PUBLICATIONS

International Search Report for International Application No. PCT/JP2021/009052; Date of Mailing, May 18, 2021.
PCT Written Opinion of the International Searching Authority for International Application No. PCT/JP2021/009052; Date of Mailing, May 18, 2021.
EPO Extended European Search Report for corresponding EP Application No. 21868920.6; Issued Sep. 16, 2024.

* cited by examiner

|  | VOLTAGE VALUE | | | RATE OF CHANGE |
|---|---|---|---|---|
|  | 0° | 50° | 100° |  |
| FIRST EMBODIMENT (Fig. 2) | 713mV | 705mV | 697mV | 0.978 |
| CONVENTIONAL MODE (Fig. 3) | 854mV | 878mV | 899mV | 1.053 |
| IDEAL | 750mV | 750mV | 750mV | 1.000 |

|  | VOLTAGE VALUE | | | RATE OF CHANGE |
|---|---|---|---|---|
|  | 0° | 50° | 100° |  |
| FIRST EMBODIMENT (Fig. 2) | 713mV | 705mV | 697mV | 0.978 |
| SECOND EMBODIMENT (Fig. 6) | 749.8mV | 749.8mV | 749.8mV | 1.000 |
| CONVENTIONAL MODE (Fig. 3) | 854mV | 878mV | 899mV | 1.053 |
| IDEAL | 750mV | 750mV | 750mV | 1.000 |

# VOLTAGE DETECTION DEVICE

CROSS REFERENCE TO RELATED APPLICATIONS

This is the U.S. national stage of application No. PCT/JP2021/009052, filed on Mar. 8, 2021. Priority under 35 U.S.C. § 119(a) and 35 U.S.C. § 365 (b) is claimed from Japanese Application No. 2020-155367, filed Sep. 16, 2020, the disclosure of which is also incorporated herein by reference.

TECHNICAL FIELD

The present invention relates to a voltage detection device that detects voltages applied to a plurality of resistance elements connected in parallel.

BACKGROUND ART

When a current flowing through a switching power supply or the like is detected, a voltage is first detected, and then a current is calculated from the detected voltage. For example, a resistance element is disposed in an output portion of a switching power supply or the like, and a voltage applied to the resistance element is detected.

A large current may flow through the resistance element. In this case, the voltage applied to the resistance element increases. It is not preferable that a large current or a large voltage is applied to the resistance element. Therefore, a plurality of resistance elements are connected in parallel. As a result, the current flows separately in each resistance element, so that the current flowing in one resistance element can be suppressed to be small. In addition, since the combined resistance value of the plurality of resistance elements connected in parallel becomes small, the voltage applied to the plurality of resistance elements connected in parallel can be suppressed to be small. For example, Patent Document 1 discloses a voltage detection device capable of detecting a voltage applied to a circuit in which a plurality of resistance elements are connected in parallel.

PRIOR ART DOCUMENT

Patent Document

Patent Document 1: Japanese Patent Laid-open Publication No. 2013-255340

SUMMARY OF THE INVENTION

Problems to be Solved by the Invention

However, when the voltage applied to the resistance elements connected in parallel is detected, the following problem may occur.

When the resistance elements connected in parallel are mounted on a substrate, the resistance elements are connected by a pattern wiring made of copper or the like. There are various configurations of such as a width, a length, and a path of the pattern wiring.

When the configuration of the pattern wiring connecting the resistance elements is different, the current may not uniformly flow to the plurality of resistance elements and may flow unevenly to a specific resistance element. In this case, the detected voltage varies depending on the position in the pattern wiring where the voltage is detected.

In addition, impedance is generated in the pattern wiring. This impedance changes the combined resistance value of the plurality of resistance elements connected in parallel. As a result, an error occurs in the detected voltage. The larger the generated impedance, the larger the error. For example, when the pattern wiring connecting two resistance elements becomes long, the impedance generated between the two resistance elements becomes large. The impedance of the pattern wiring varies depending on the temperature. The higher the temperature, the larger the generated impedance.

Therefore, an object of the present invention is to solve the above problems, and to provide a voltage detection device capable of reducing variations and errors in detection voltage caused by the influence of the configuration of a pattern wiring and temperature when detecting voltages applied to a plurality of resistance elements connected in parallel.

Means for Solving the Problems

In order to achieve the above object, the present invention is configured as follows.

A voltage detection device according to one aspect of the present invention includes:
- a resistance unit including a plurality of resistance elements connected in parallel;
- a differential amplifier circuit;
- a first connection portion that connects a plurality of positions different from each other in one end portion of the resistance unit and a first input terminal of the differential amplifier circuit; and
- a second connection portion that connects a plurality of positions different from each other in the other end portion of the resistance unit and a second input terminal of the differential amplifier circuit,
- wherein the voltage detection device configures to detect a voltage applied to the resistance unit based on a voltage of an output terminal of the differential amplifier circuit.

Effects of the Invention

According to the present invention, it is possible to reduce variations and errors in detection voltage caused by the influence of the configuration of a pattern wiring and temperature when detecting the voltages applied to the plurality of resistance elements connected in parallel.

MODES FOR CARRYING OUT THE INVENTION

Figure 1:
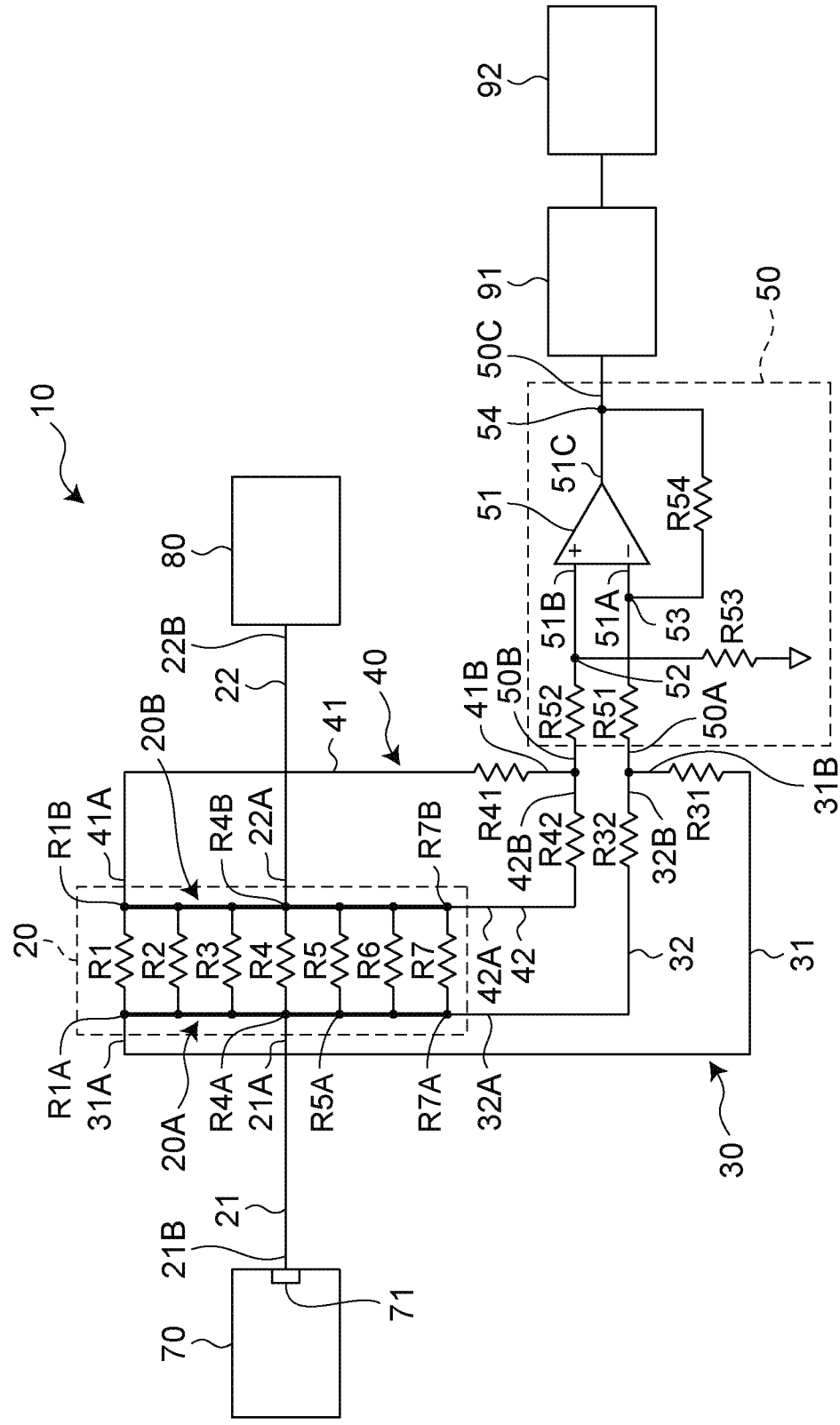
FIG. 1 is a circuit diagram of a voltage detection device according to a first embodiment of the present invention.

A voltage detection device according to one aspect of the present invention includes:
- a resistance unit including a plurality of resistance elements connected in parallel;
- a differential amplifier circuit;
- a first connection portion that connects a plurality of positions different from each other in one end portion of the resistance unit and a first input terminal of the differential amplifier circuit; and
- a second connection portion that connects a plurality of positions different from each other in the other end portion of the resistance unit and a second input terminal of the differential amplifier circuit,
- wherein the voltage detection device configures to detect a voltage applied to the resistance unit based on a voltage of an output terminal of the differential amplifier circuit.

According to this configuration, the one end portion of the resistance unit and the differential amplifier circuit are connected by the plurality of wirings. As a result, it is possible to detect a voltage in which the influence of the configuration of the wiring pattern of the resistance unit and the temperature is suppressed to be low.

The first connection portion includes:
- a first wiring portion that connects one end of a first resistance element, which is one of the first resistance element and a second resistance element located at positions farthest from each other among the plurality of resistance elements of the resistance unit, and the first input terminal; and
- a second wiring portion that connects one end of the second resistance element and the first input terminal, and the second connection portion includes:
- a third wiring portion that connects the other end of the first resistance element and the second input terminal; and
- a fourth wiring portion connecting the other end of the second resistance element and the second input terminal.

According to this configuration, the first wiring portion and the third wiring portion extend from the first resistance element, and the second wiring portion and the fourth wiring portion extend from the second resistance element. Here, the first resistance element and the second resistance element are two resistance elements farthest from each other among the plurality of resistance elements. In such a configuration, the influence of the wiring pattern can be suppressed to be lower than in a configuration in which two resistance elements to which the wiring portions are connected are located closer to each other, and thus, the influence of uneven current flow due to the difference in the configuration of the pattern wiring connecting the resistance elements can be reduced.

The first connection portion may connect one end of each of the plurality of resistance elements and the first input terminal, and
the second connection portion may connect the other end of each of the plurality of resistance elements and the second input terminal.

According to this configuration, the wiring portions extend from all the resistance elements of the resistance unit. In such a configuration, it is possible to detect a voltage in which the influence of the configuration of the wiring pattern of the resistance unit and the temperature is suppressed to be lower than in a configuration in which the wiring portion extends from some resistance elements among the plurality of resistance elements included in the resistance unit.

One ends of the plurality of resistance elements are connected in a state of being aligned in a first direction at the one end portion of the resistance unit,
- a plurality of positions of the first connection portion are located at equal intervals in the first direction,
- the other ends of the plurality of resistance elements are connected in a state of being aligned in a second direction at the other end portion of the resistance unit, and
- a plurality of positions of the second connection portion may be located at equal intervals in the second direction.

Also with this configuration, the one end portion and the other end portion of the resistance unit are connected to the differential amplifier circuit by the plurality of wirings. As a result, it is possible to detect a voltage in which the influence of the configuration of the wiring pattern of the resistance unit and the temperature is suppressed to be low.

First Embodiment

FIG. 1 is a circuit diagram of a voltage detection device according to a first embodiment of the present invention.

A voltage detection device 10 is connected to an external device. The voltage detection device 10 of the first embodiment is connected to an output unit 71 of a switching power supply 70 as an example of an external device. The voltage detection device 10 can detect a voltage applied to a resistance unit 20 included in the voltage detection device 10. Based on the resistance value of the resistance unit 20 and the detected voltage, a current flowing through the output unit can be calculated by Ohm's law.

As illustrated in FIG. 1, the voltage detection device 10 includes the resistance unit 20, a first connection portion 30, a second connection portion 40, and a differential amplifier circuit 50.

The resistance unit 20 is a circuit in which seven resistance elements R1 to R7 are connected in parallel. The resistance value of each of the resistance elements R1 to R7 is 30 mΩ. The resistance value of each of the resistance elements R1 to R7 is not limited to 30 mΩ. The resistance values of the resistance elements R1 to R7 may be equal to each other as described above or may be different from each other. In addition, the number of resistance elements included in the resistance unit 20 is not limited to seven.

An input wiring 21 and an output wiring 22 are connected to the resistance unit 20.

One end portion 21A of the input wiring 21 is connected to one end R4A of a resistance element R4 in one end portion 20A of the resistance unit 20. The one end portion 20A of the resistance unit 20 is an end portion on one side (switching power supply side) of the resistance elements R1 to R7 connected in parallel, and is a portion indicated by a thick line in FIG. 1.

The other end portion 21B of the input wiring 21 is connected to, for example, the output unit 71 of the switching power supply 70.

The one end portion 22A of the output wiring 22 is connected to the other end R4B of the resistance element R4 in the other end portion 20B of the resistance unit 20. The other end portion 20B of the resistance unit 20 is an end portion on the other side (opposite side to the switching power supply) of the resistance elements R1 to R7 connected in parallel, and is a portion indicated by a thick line in FIG. 1.

The other end portion 22B of the output wiring 22 is connected to, for example, an external device 80 to which power is supplied by the switching power supply 70.

Note that the input wiring 21 and the output wiring 22 may be connected to other than the resistance element R4 among the resistance elements R1 to R7. In addition, the resistance element to which the input wiring 21 is connected and the resistance element to which the output wiring 22 is connected may be different resistance elements. For example, the one end portion 21A of the input wiring 21 may be connected to one end R1A of the resistance element R1 in the one end portion 20A of the resistance unit 20, and the one end portion 22A of the output wiring 22 may be connected to the other end R7B of the resistance element R7 in the other end portion 20B of the resistance unit 20.

The first connection portion 30 includes two wiring portions 31 and 32. The wiring portion 31 is an example of a first wiring portion. The wiring portion 32 is an example of a second wiring portion.

One end portion 31A of the wiring portion 31 is connected to the one end R1A of the resistance element R1 in the one end portion 20A of the resistance unit 20. The other end portion 31B of the wiring portion 31 is connected to an input terminal 50A of the differential amplifier circuit 50. In this case, the input terminal 50A corresponds to a first input terminal.

A resistance element R31 is disposed in the wiring portion 31. The resistance value of the resistance element R31 is 1Ω. The resistance value of the resistance element R31 is not limited to 1Ω.

One end portion 32A of the wiring portion 32 is connected to one end R7A of the resistance element R7 in the one end portion 20A of the resistance unit 20. The other end portion 32B of the wiring portion 32 is connected to the input terminal 50A of the differential amplifier circuit 50.

A resistance element R32 is disposed in the wiring portion 32. The resistance value of the resistance element R32 is 1Ω. The resistance value of the resistance element R32 is not limited to 1Ω. The resistance value of the resistance element R32 may be the same as or different from the resistance value of the resistance element R31.

The second connection portion 40 includes two wiring portions 41 and 42. The wiring portion 41 is an example of a third wiring portion. The wiring portion 42 is an example of a fourth wiring portion.

One end portion 41A of the wiring portion 41 is connected to the other end R1B of the resistance element R1 in the other end portion 20B of the resistance unit 20. The other end portion 41B of the wiring portion 41 is connected to an input terminal 50B of the differential amplifier circuit 50. In this case, the input terminal 50B corresponds to a second input terminal.

A resistance element R41 is disposed in the wiring portion 41. The resistance value of the resistance element R41 is 1Ω. The resistance value of the resistance element R41 is not limited to 1Ω.

One end portion 42A of the wiring portion 42 is connected to the other end R7B of the resistance element R7 in the other end portion 20B of the resistance unit 20. The other end portion 42B of the wiring portion 42 is connected to the input terminal 50B of the differential amplifier circuit 50.

A resistance element R42 is disposed in the wiring portion 42. The resistance value of the resistance element R42 is 1Ω. The resistance value of the resistance element R42 is not limited to 1Ω. The resistance value of the resistance element R42 may be the same as or different from the resistance value of the resistance element R41. The resistance values of the resistance elements R41 and R42 may be the same as or different from the resistance values of the resistance elements R31 and R32 of the wiring portion 41.

The resistance element R1 and the resistance element R7 are at positions farthest from each other among the seven resistance elements R1 to R7 included in the resistance unit 20. That is, in the first embodiment, the wiring portions 31 and 41 are connected to the one end R1A and the other end R1B of one (resistance element R1) of the two resistance elements R1 and R7 at the positions farthest from each other among the seven resistance elements R1 to R7 included in the resistance unit 20. On the other hand, the wiring portions 32 and 42 are connected to the one end R7A and the other end R7B of the other (resistance element R7) of the two resistance elements R1 and R7 at the positions farthest from each other among the seven resistance elements R1 to R7 included in the resistance unit 20. The resistance element R1 is an example of a first resistance element. The resistance element R2 is an example of a second resistance element.

On the condition that the connection positions of the wiring portions 31 and 32 to the one end portion 20A of the resistance unit 20 are different from each other, the connection positions of the wiring portions 31 and 32 to the one end portion 20A of the resistance unit 20 are not limited to the one end R1A of the resistance element R1 and the one end R7A of the resistance element R7. For example, the wiring portion 31 may be connected to the one end R4A of the resistance element R4, and the wiring portion 32 may be connected to one end R5A of the resistance element R5. That is, the two resistance elements to which the wiring portions 31 and 32 are connected may not be at the positions farthest from each other among the seven resistance elements R1 to R7 included in the resistance unit 20. In addition, for example, the wiring portions 31 and 32 may be connected to a position between two adjacent resistance elements in the one end portion 20A of the resistance unit 20. That is, the connection positions of the wiring portions 31 and 32 to the one end portion 20A of the resistance unit 20 are not limited to one ends of the resistance elements R1 to R7.

Similarly, on the condition that the connection positions of the wiring portions 31 and 32 to the other end portion 20B of the resistance unit 20 are different from each other, the connection positions of the wiring portions 41 and 42 to the other end portion 20B of the resistance unit 20 are not limited to the other end R1B of the resistance element R1 and the other end R7B of the resistance element R7.

A known configuration is adopted for the differential amplifier circuit 50. As described above, the input terminal 50A of the differential amplifier circuit 50 is connected to the wiring portions 31 and 32 of the first connection portion 30, and the input terminal 50B of the differential amplifier circuit 50 is connected to the wiring portions 41 and 42 of the second connection portion 40. In the first embodiment, an output terminal 50C of the differential amplifier circuit 50 is connected to a calculation unit 91. The calculation unit 91 includes a central processing unit (CPU), a memory, and the like. The calculation unit 91 calculates a value of a current flowing through the resistance unit 20 from the voltage value of the output terminal 50C of the differential amplifier circuit 50 and outputs the current value. The calculation unit 91 is connected to a display unit 92. In the first embodiment, the display unit 92 is a known display including a plurality of LEDs, liquid crystals, and the like. The current value output from the calculation unit 91 is input to the display unit 92. The display unit 92 displays the input current value in a form (for example, a number) that can be recognized by a user.

In the above description, the voltage value of the output terminal 50C of the differential amplifier circuit 50 is converted into a current value in the calculation unit 91, and the display unit 92 displays the current value. However, the display unit 92 may display the voltage value of the output terminal 50C of the differential amplifier circuit 50. In this case, the output terminal 50C of the differential amplifier circuit 50 may be connected to the display unit 92 without passing through the calculation unit 91.

The differential amplifier circuit 50 includes an operational amplifier 51 and resistance elements R51, R52, R53, and R54.

As the operational amplifier 51, a known one is used.

The gain of the differential amplifier circuit 50 is a ratio between an input voltage (difference between the voltage of the input terminal 50B and the voltage of the input terminal 50A) and an output voltage (voltage of the output terminal 50C). In the differential amplifier circuit 50, the resistance values of the resistance element R51 and the resistance element R52 are equal, the resistance values of the resistance element R53 and the resistance element R54 are equal, and the gain of the differential amplifier circuit 50 is R54/R51. In the first embodiment, the resistance elements R51 and R52 are 1 kΩ. The resistance elements R53 and R54 are 100 kΩ. That is, in the first embodiment, the gain of the differential amplifier circuit 50 is 100. The resistance values of the resistance elements R51 and R52 are not limited to 1 kΩ, and the resistance values of the resistance elements R53 and R54 are not limited to 100 kΩ. That is, the gain of the differential amplifier circuit 50 is not limited to 100.

The resistance values of the resistance elements R51 and R52 are set to be extremely larger than the resistance values of the resistance elements R31 and R32 of the first connection portion 30 and the resistance elements R41 and R42 of the second connection portion 40. In other words, the resistance values of the resistance elements R31 and R32 of the first connection portion 30 and the resistance elements R41 and R42 of the second connection portion 40 are set to be extremely smaller than the resistance values of the resistance elements R51 and R52 to such an extent that the operation of the differential amplifier circuit 50 is not affected. In the first embodiment, the resistance values (1 kΩ) of the resistance elements R51 and R52 are set to 1000 times the resistance values (1Ω) of the resistance elements R31, R32, R41, and R42. The resistance values of the resistance elements R51 and R52 may be a magnification other than 1000 times the resistance values of the resistance elements R31, R32, R41, and R42.

The resistance element R51 is disposed on a wiring connecting the input terminal 50A of the differential amplifier circuit 50 and an inverting input terminal 51A of the operational amplifier 51. The resistance element R52 is disposed on a wiring connecting the input terminal 50B of the differential amplifier circuit 50 and a non-inverting input terminal 51B of the operational amplifier 51. The resistance element R53 is disposed on a wiring connecting the connection point 52 and the ground. The connection point 52 is located on the wiring between the resistance element R52 and the non-inverting input terminal 51B of the operational amplifier 51. The resistance element R54 is disposed between the connection point 53 and the connection point 54. The connection point 53 is located on the wiring between the resistance element R51 and the inverting input terminal 51A of the operational amplifier 51. The connection point 54 is located on the wiring between an output terminal 51C of the operational amplifier 51 and the output terminal 50C of the differential amplifier circuit 50.

In the above description, the configuration of the voltage detection device 10 has been described on the basis of the circuit diagram illustrated in FIG. 1. However, in practice, the voltage detection device 10 is configured by mounting elements such as a resistance element and an operational amplifier on a substrate. In addition, the elements are connected by a pattern wiring made of copper or the like. That is, the wirings such as the one end portion 20A and the other end portion 20B of the resistance unit 20 illustrated in FIG. 1 are pattern wirings made of copper or the like. For example, in the above description, "connected to the one end R1A of the resistance element R1" includes not only being connected to the one end R1A of the resistance element R1 but also being connected to the pattern wiring located in the vicinity of the one end R1A of the resistance element Rt. Furthermore, for example, in the above description, "connected to a position between two adjacent resistance elements in the one end portion 20A of the resistance unit 20" means being connected to a pattern wiring connecting the two resistance elements.

Figure 2:
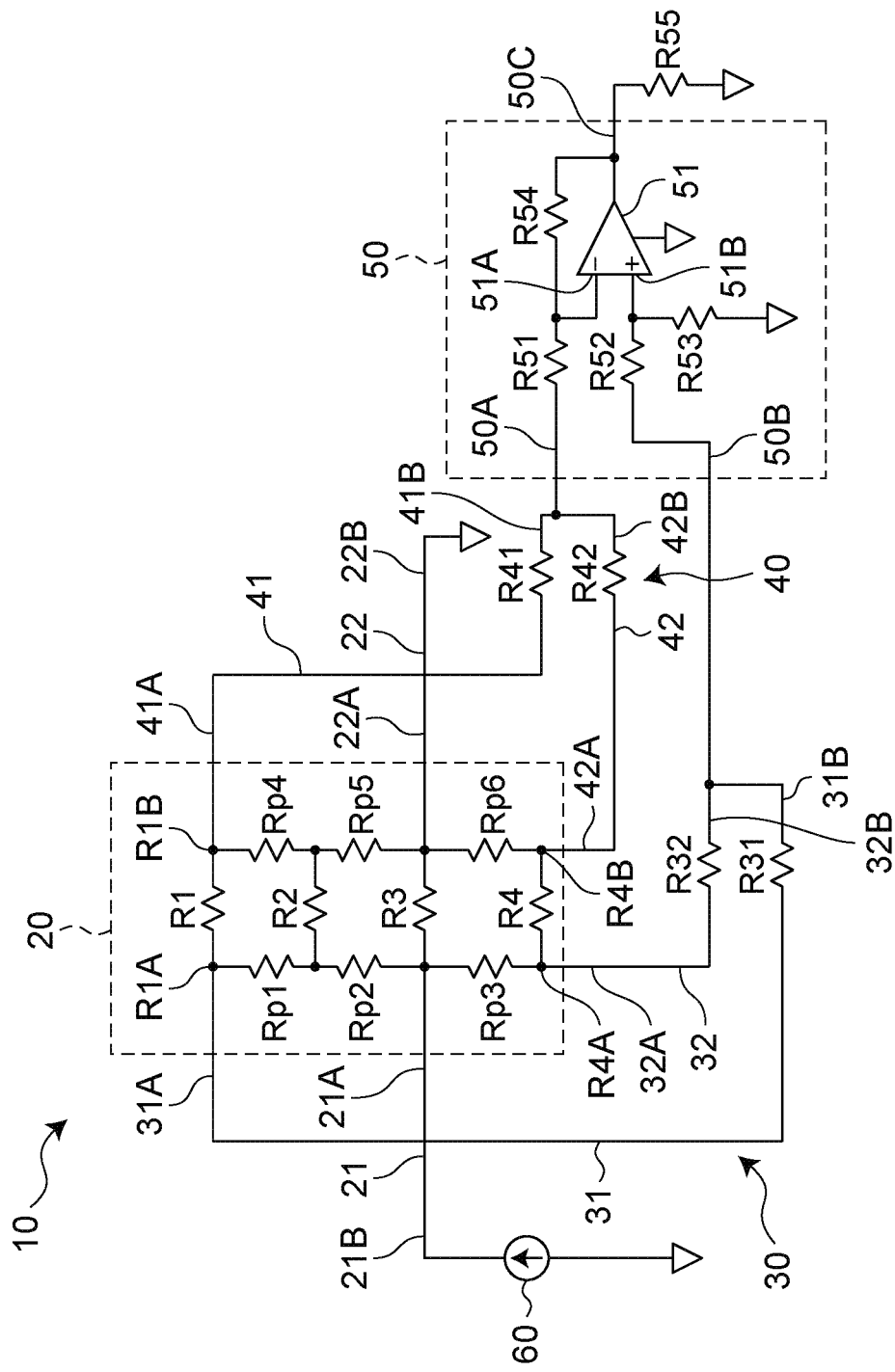
FIG. 2 is a circuit diagram of the voltage detection device according to the first embodiment of the present invention used for simulation.
Figure 3:
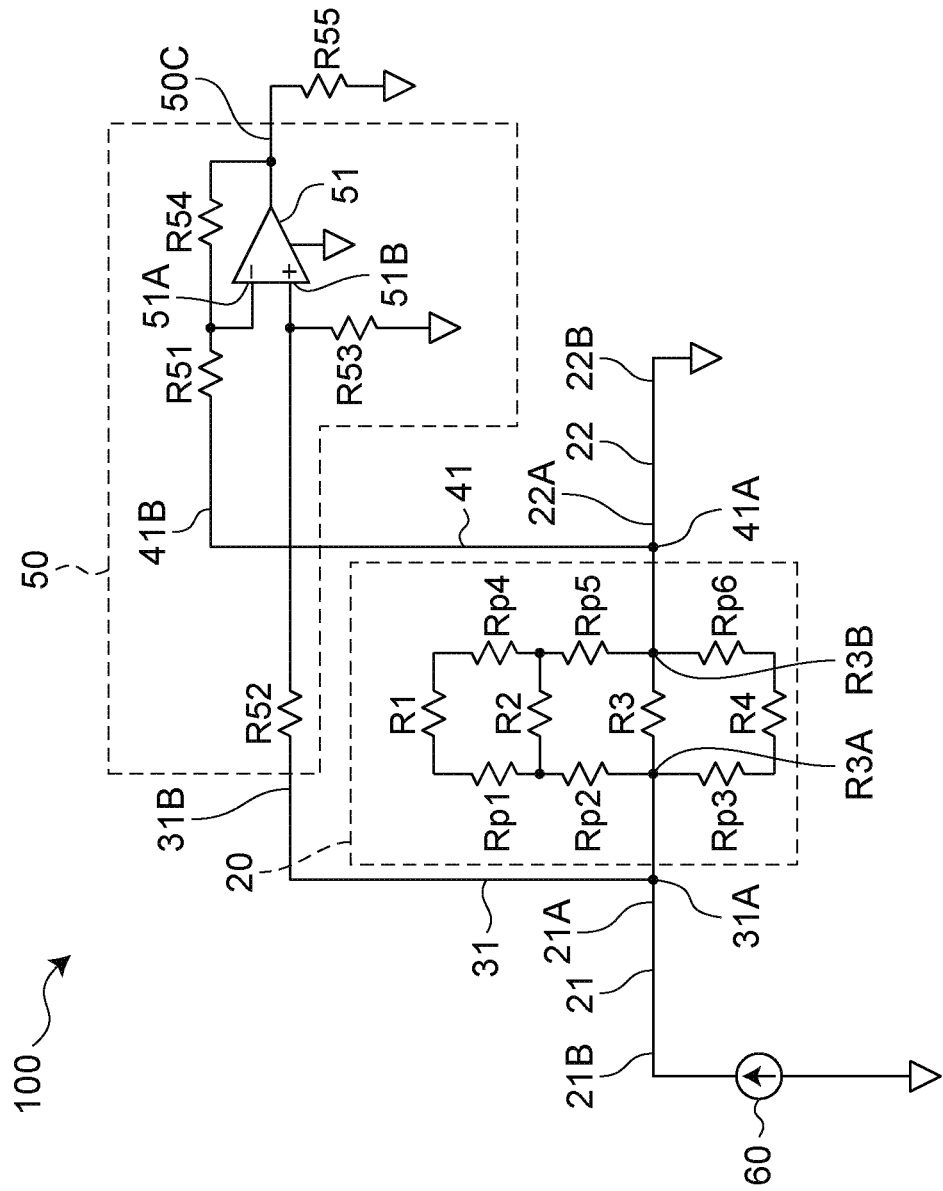
FIG. 3 is a circuit diagram of a voltage detection device according to a conventional mode used for simulation.

FIG. 2 is a circuit diagram of the voltage detection device according to the first embodiment of the present invention used for simulation. FIG. 3 is a circuit diagram of a voltage detection device according to a conventional mode used for simulation.

Hereinafter, simulation results of voltage detection between the voltage detection device 10 (voltage detection device illustrated in FIG. 2) according to the first embodiment of the present invention and a voltage detection device 100 (voltage detection device illustrated in FIG. 3) according to the conventional mode will be described.

The voltage detection device 10 illustrated in FIG. 2 has substantially the same configuration as the voltage detection device 10 illustrated in FIG. 1 but differs in the following points.

In the voltage detection device 10 illustrated in FIG. 2, the resistance elements included in the resistance unit 20 are four resistance elements R1 to R4. In the resistance unit 20, resistance elements Rp1 to Rp6 are disposed between two adjacent resistance elements. The resistance elements Rp1 to Rp6 indicate impedances generated in pattern wirings (the one end portion 20A and the other end portion 20B) constituting the resistance unit 20. For example, the resistance element Rp1 indicates impedance generated in the pattern wiring existing between the adjacent resistance elements R1 and R2 among the pattern wirings constituting the one end portion 20A. The same applies to the resistance elements Rp2 and Rp3. In addition, for example, the resistance element Rp4 indicates impedance generated in the pattern wiring existing between the adjacent resistance elements R1 and R2 among the pattern wirings constituting the other end portion 20B. The same applies to the resistance elements Rp5 and Rp6.

In the voltage detection device 10 illustrated in FIG. 2, the one end portion 31A of the wiring portion 31 is connected to the one end R1A of the resistance element R1. The one end portion 32A of the wiring portion 32 is connected to the one end R4A of the resistance element R4. The other end portions 31B and 32B of the wiring portions 31 and 32 are connected to the input terminal 50B of the differential amplifier circuit 50. In this case, the input terminal 50B corresponds to the first input terminal. The one end portion 41A of the wiring portion 41 is connected to the other end R1B of the resistance element R1. The one end portion 42A of the wiring portion 42 is connected to the other end R4B of the resistance element R4. The other end portions 41B and 42B of the wiring portions 41 and 42 are connected to the input terminal 50A of the differential amplifier circuit 50. In this case, the input terminal 50A corresponds to the second input terminal.

The voltage detection device 100 illustrated in FIG. 3 is different from the voltage detection device 10 illustrated in FIG. 2 in the following points.

In the voltage detection device 100 illustrated in FIG. 3, the first connection portion 30 and the second connection portion 40 include only one wiring portion. The first connection portion 30 includes the wiring portion 31 but does not include the wiring portion 32, and the second connection portion 40 includes the wiring portion 41 but does not include the wiring portion 42.

In the voltage detection device 100 illustrated in FIG. 3, the one end portion 31A of the wiring portion 31 is connected to one end R3A of the resistance element R3. The resistance element R31 is not disposed in the wiring portion 31. The one end portion 41A of the wiring portion 41 is connected to the other end R3B of the resistance element R3. The resistance element R41 is not disposed in the wiring portion 41.

In the voltage detection device 10 illustrated in FIG. 2 and the voltage detection device 100 illustrated in FIG. 3, the other end portion 21B of the input wiring 21 is connected to the power supply 60. The power supply 60 represents an external device such as a switching power supply in a pseudo manner. The other end portion 22B of the output wiring 22 of the voltage detection device 10 is connected to the ground. The ground represents an external device different from the switching power supply in a pseudo manner. The output terminal 50C of the differential amplifier circuit 50 is connected to the ground via a resistance element R55.

In the simulation, a current of 1 A was passed from the power supply 60 to each of the voltage detection devices 10 and 100, and the voltage at the output terminal 50C of the differential amplifier circuit 50 of each of the voltage detection devices 10 and 100 at that time was measured. The simulation was performed for each case where the temperature around each of the voltage detection devices 10 and 100 was 0° C., 50° C., and 100° C. In the simulation, the difference in temperature was represented by the difference in resistance values of the resistance elements Rp1 to Rp6. That is, the resistance values of the resistance elements Rp1 to Rp6 at the respective temperatures were set based on the fact that the higher the temperature, the larger the impedance generated in the pattern wiring. In the simulation, the resistance values of the resistance elements Rp1 to Rp6 at a temperature of 0° C. were set to 1.5 mΩ, the resistance values of the resistance elements Rp1 to Rp6 at a temperature of 50° C. were set to 1.89 mΩ, and the resistance values of the resistance elements Rp1 to Rp6 at a temperature of 100° C. were set to 2.23 mΩ.

Figures 4, 5:
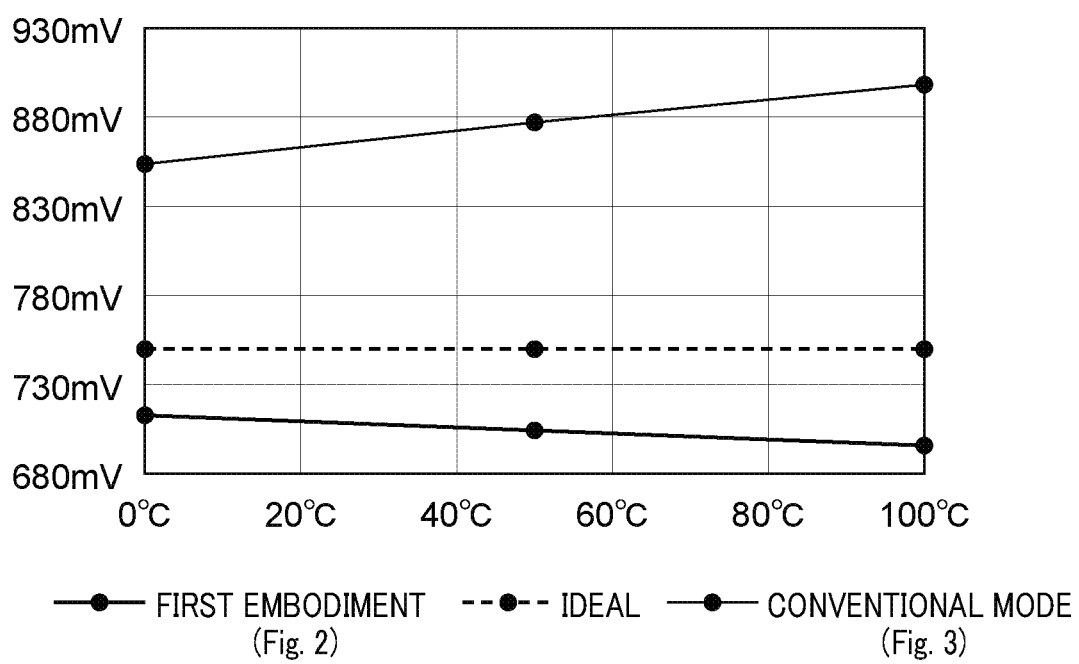
FIG. 4 is a table showing simulation results according to the first embodiment.
FIG. 5 is a graph showing the simulation results of the first embodiment.

The results of the simulation are shown in FIG. 4 and FIG. 5. FIG. 4 is a table showing simulation results according to the first embodiment. FIG. 5 is a graph showing the simulation results of the first embodiment.

FIG. 4 and FIG. 5 show the voltage value of the output terminal 50C of the differential amplifier circuit 50 in the voltage detection device 10 illustrated in FIG. 2, the voltage value of the output terminal 50C of the differential amplifier circuit 50 in the voltage detection device 100 illustrated in FIG. 3, and the ideal voltage value of the output terminal 50C of the differential amplifier circuit 50 for each temperature of 0° C., 50° C., and 100° C. The ideal voltage value is a voltage value of the output terminal 50C of the differential amplifier circuit 50 when the resistance elements Rp1 to Rp6 do not exist.

As shown in FIG. 4 and FIG. 5, the ideal voltage value is 750 mV regardless of the temperature. That is, in both the voltage detection device 10 illustrated in FIG. 2 and the voltage detection device 100 illustrated in FIG. 3, when the resistance elements Rp1 to Rp6 do not exist, the voltage value of the output terminal 50C of the differential amplifier circuit 50 is 750 mV.

In the voltage detection device 100 (voltage detection device 100 according to the conventional mode) illustrated in FIG. 3, the voltage value of the output terminal 50C of the differential amplifier circuit 50 is 854 mV when the temperature is 0° C., 878 mV when the temperature is 50° C., and 899 mV when the temperature is 100° C. All of these voltage values are higher than the ideal voltage value of 750 mV.

In the voltage detection device 100 according to the conventional mode, the voltage value of the output terminal 50C of the differential amplifier circuit 50 increases as the temperature increases. The rate of change in the voltage value of the output terminal 50C of the differential amplifier circuit 50 when the temperature changes from 0° C. to 100° C. is a value obtained by dividing 899 by 854 and is approximately 1.053.

In the voltage detection device 100 according to the conventional mode, the difference between the voltage value of the output terminal 50C of the differential amplifier circuit 50 and the ideal voltage value is 104 mV to 149 mV.

On the other hand, in the voltage detection device 10 (voltage detection device 10 according to the first embodiment) illustrated in FIG. 2, the voltage value of the output terminal 50C of the differential amplifier circuit 50 is 713 mV when the temperature is 0° C., 705 mV when the temperature is 50° C., and 697 mV when the temperature is 100° C. All of these voltage values are lower than the ideal voltage value of 750 mV.

In the voltage detection device 10 according to the first embodiment, the voltage value of the output terminal 50C of the differential amplifier circuit 50 decreases as the temperature increases. The rate of change in the voltage value of the output terminal 50C of the differential amplifier circuit 50 when the temperature changes from 0° C. to 100° C. is a value obtained by dividing 697 by 713 and is approximately 0.978. Ideally, the voltage value of the output terminal 50C of the differential amplifier circuit 50 does not change regardless of the temperature. That is, the ideal value of the rate of change in the voltage value is 1. The rate of change (approximately 0.978) in the voltage value in the voltage detection device 10 according to the first embodiment is smaller than the rate of change (approximately 1.053) in the voltage value in the voltage detection device 100 according to the conventional mode. That is, the rate of change in the voltage value in the voltage detection device 10 according to the first embodiment is closer to the ideal value than the rate of change in the voltage value in the voltage detection device 100 according to the conventional mode. This can also be seen from the fact that in FIG. 5, the absolute value of the slope of the characteristic of the voltage value of the voltage detection device 10 according to the first embodiment is smaller than the absolute value of the slope of the characteristic of the voltage value of the voltage detection device 100 according to the conventional mode.

In the voltage detection device 10 according to the first embodiment, the difference between the voltage value of the output terminal 50C of the differential amplifier circuit 50 and the ideal voltage value is 37 mV to 53 mV, which is smaller than the difference (104 mV to 149 mV) in the voltage detection device 100 according to the conventional mode.

According to the first embodiment, the one end portion 20A of the resistance unit 20 and the differential amplifier circuit 50 are connected by the plurality of wiring portions 31 and 32. As a result, it is possible to detect a voltage in which the influence of the configuration of the wiring pattern of the resistance unit 20 and the temperature is suppressed to be low.

According to the first embodiment, the wiring portions 31 and 41 extend from the one end R1A and the other end R1B of the resistance element R1, and the wiring portions 32 and 42 extend from the one end R7A and the other end R7B of the resistance element R7. Here, the resistance elements R1 and R7 are two resistance elements farthest from each other among the plurality of resistance elements R1 to R7. In the first embodiment, the influence of the wiring pattern can be suppressed to be lower than in a configuration in which two resistance elements to which the wiring portions are connected are located closer to each other, and thus, the influence of uneven current flow due to the difference in the configuration of the pattern wiring connecting the resistance elements can be reduced.

In the first embodiment, the first connection portion 30 includes the two wiring portions 31 and 32, and the second connection portion 40 includes the two wiring portions 41 and 42. However, the number of wiring portions included in the first connection portion 30 and the second connection portion 40 is not limited to two. For example, each of the first connection portion 30 and the second connection portion 40 may include three wiring portions. In this case, the three wiring portions included in the first connection portion 30 are connected to, for example, one ends of the resistance elements R1, R4, and R7 in the one end portion 20A of the resistance unit 20. In this case, the three wiring portions included in the second connection portion 40 are connected to, for example, the other ends of the resistance elements R1, R4, and R7 in the other end portion 20B of the resistance unit 20.

In the first embodiment, the wiring portions of the first connection portion 30 and the second connection portion 40 are both connected to the resistance elements R1 and R7. That is, the wiring portion of the first connection portion 30 and the wiring portion of the second connection portion 40 are connected to the same resistance element. However, the wiring portion of the first connection portion 30 and the wiring portion of the second connection portion 40 may be connected to different resistance elements. For example, the wiring portion of the first connection portion 30 may be connected to one ends of the resistance elements R1 and R7, and the wiring portion of the second connection portion 40 may be connected to the other ends of the resistance elements R3 and R4. A part of the wiring portion of the first connection portion 30 and a part of the wiring portion of the second connection portion 40 may be disposed in the same resistance element, and the rest of the wiring portion of the first connection portion 30 and the rest of the wiring portion of the second connection portion 40 may be connected to different resistance elements. For example, the wiring portion of the first connection portion 30 may be connected to one ends of the resistance elements R1 and R7, and the wiring portion of the second connection portion 40 may be connected to the other ends of the resistance elements R1 and R5.

In the first embodiment, the first connection portion 30 and the second connection portion 40 include the same number of wiring portions. However, the first connection portion 30 and the second connection portion 40 may include different numbers of wiring portions. For example, the first connection portion 30 may include two wiring portions connected to one ends of the resistance elements R2 and R6, and the second connection portion 40 may include three wiring portions connected to the other ends of the resistance elements R1, R4, and R7. Further, for example, the first connection portion 30 may include four wiring portions connected to one ends of the resistance elements R1, R2, R6, and R7, and the second connection portion 40 may include three wiring portions connected to the other ends of the resistance elements R2, R3, and R4.

Second Embodiment

Figure 6:
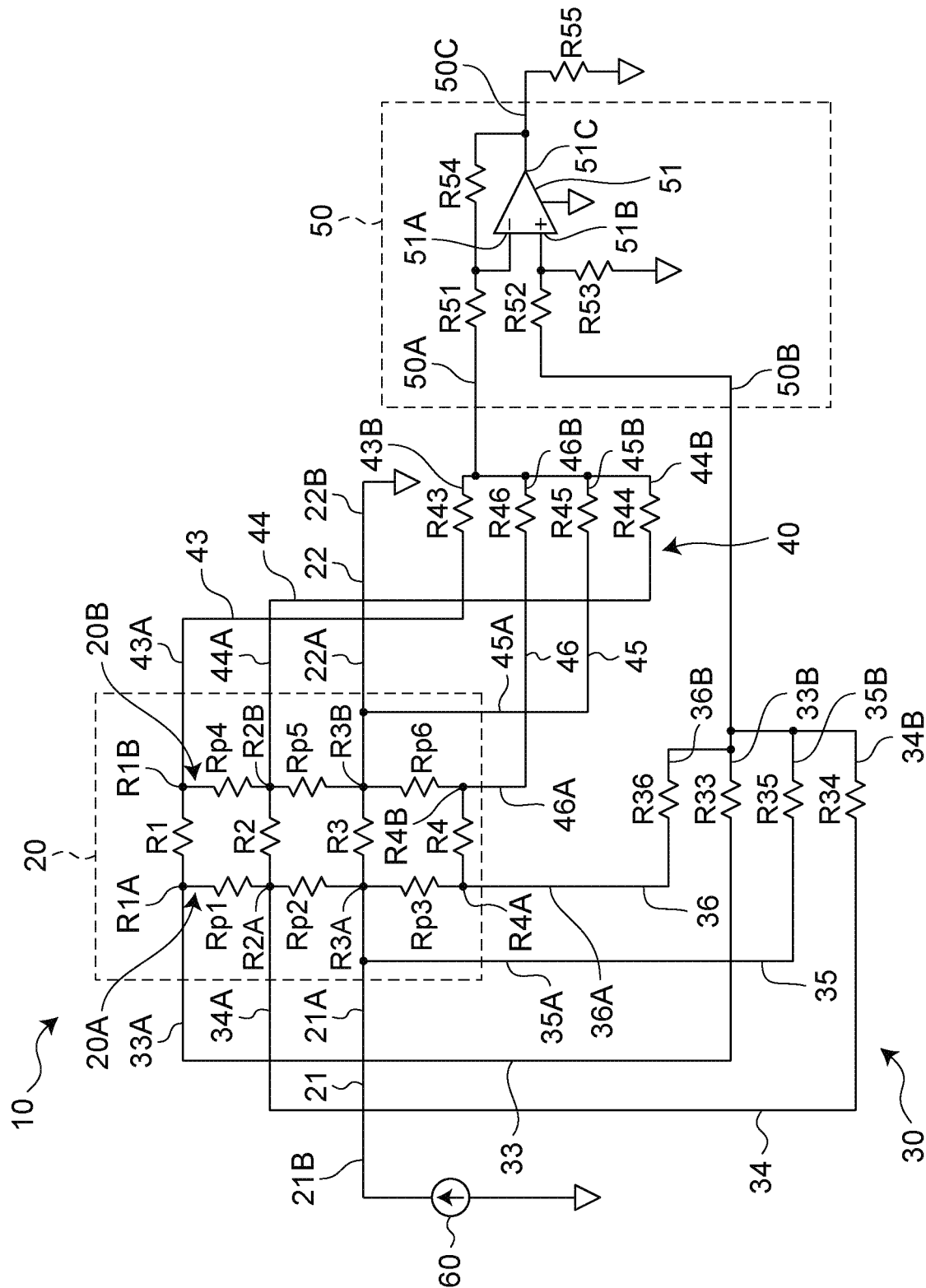
FIG. 6 is a circuit diagram of a voltage detection device according to a second embodiment of the present invention.

FIG. 6 is a circuit diagram of a voltage detection device according to a second embodiment of the present invention. The voltage detection device 10 according to the second embodiment is different from the voltage detection device 10 according to the first embodiment in that each of the first connection portion 30 and the second connection portion 40 includes a wiring portion corresponding to each of the plurality of resistance elements of the resistance unit 20.

As illustrated in FIG. 6, the first connection portion 30 includes four wiring portions 33 to 36, and the second connection portion 40 includes four wiring portions 43 to 46.

One end portion 33A of the wiring portion 33 is connected to the one end R1A of the resistance element R1 in the one end portion 20A of the resistance unit 20. One end portion 34A of the wiring portion 34 is connected to one end R2A of the resistance element R2 in the one end portion 20A of the resistance unit 20. One end portion 35A of the wiring portion 35 is connected to the one end R3A of the resistance element R3 in the one end portion 20A of the resistance unit 20. One end portion 36A of the wiring portion 36 is connected to the one end R4A of the resistance element R4 in the one end portion 20A of the resistance unit 20. The other end portions 33B, 34B, 35B, and 36B of the wiring portions 33, 34, 35, and 36 are connected to the input terminal 50B of the differential amplifier circuit 50. In this case, the input terminal 50B corresponds to the first input terminal.

A resistance element R33 is disposed in the wiring portion 33. A resistance element R34 is disposed in the wiring portion 34. A resistance element R35 is disposed in the wiring portion 35. A resistance element R36 is disposed in the wiring portion 36. In the second embodiment, the resistance value of each of the resistance elements R33 to R36 is 1Ω similarly to the resistance elements R31 and R32 of the first embodiment, but is not limited to 1Ω.

One end portion 43A of the wiring portion 43 is connected to the other end R1B of the resistance element R1 in the other end portion 20B of the resistance unit 20. One end portion 44A of the wiring portion 44 is connected to the other end R2B of the resistance element R2 in the other end portion 20B of the resistance unit 20. One end portion 45A of the wiring portion 45 is connected to the other end R3B of the resistance element R3 in the other end portion 20B of the resistance unit 20. One end portion 46A of the wiring portion 46 is connected to the other end R4B of the resistance element R4 in the other end portion 20B of the resistance unit 20. The other end portions 43B, 44B, 45B, and 46B of the wiring portions 43, 44, 45, and 46 are connected to the input terminal 50A of the differential amplifier circuit 50. In this case, the input terminal 50A corresponds to the second input terminal.

A resistance element R43 is disposed in the wiring portion 43. A resistance element R44 is disposed in the wiring portion 44. A resistance element R45 is disposed in the wiring portion 45. A resistance element R46 is disposed in the wiring portion 46. In the second embodiment, the resistance value of each of the resistance elements R43 to R46 is 1Ω similarly to the resistance elements R41 and R42 of the first embodiment, but is not limited to 1Ω.

As described above, in the second embodiment, each of the wiring portions 33 to 36 of the first connection portion 30 connects one end of each of the plurality of resistance elements R1 to R4 of the resistance unit 20 in the one end portion 20A of the resistance unit 20 and the input terminal 50B of the differential amplifier circuit 50. In addition, each of the wiring portions 43 to 46 of the second connection portion 40 connects the other end of each of the plurality of resistance elements R1 to R4 of the resistance unit 20 in the other end portion 20B of the resistance unit 20 and the input terminal 50A.

Hereinafter, a simulation result of the voltage detection device 10 according to the second embodiment of the present invention will be described. As the voltage detection device 10 according to the second embodiment of the present invention, a voltage detection device 10 illustrated in FIG. 6 is used. In the description, the simulation result of the voltage detection device 10 according to the second embodiment of the present invention is compared with the voltage detection device 10 according to the first embodiment of the present invention (see FIG. 4) and the voltage detection device 100 according to the conventional mode (see FIG. 5).

The simulation in the second embodiment was performed similarly to the simulation in the first embodiment. That is, a current of 1 A was passed from the power supply 60 to the voltage detection device 10, and the voltage of the output terminal 50C of the differential amplifier circuit 50 at that time was measured. In addition, simulation was performed for each case where the temperature around the voltage detection device 10 was 0° C., 50° C., and 100° C. Further, in the simulation, the difference in temperature was represented by the difference in resistance values of the resistance elements Rp1 to Rp6.

Figures 7, 8:
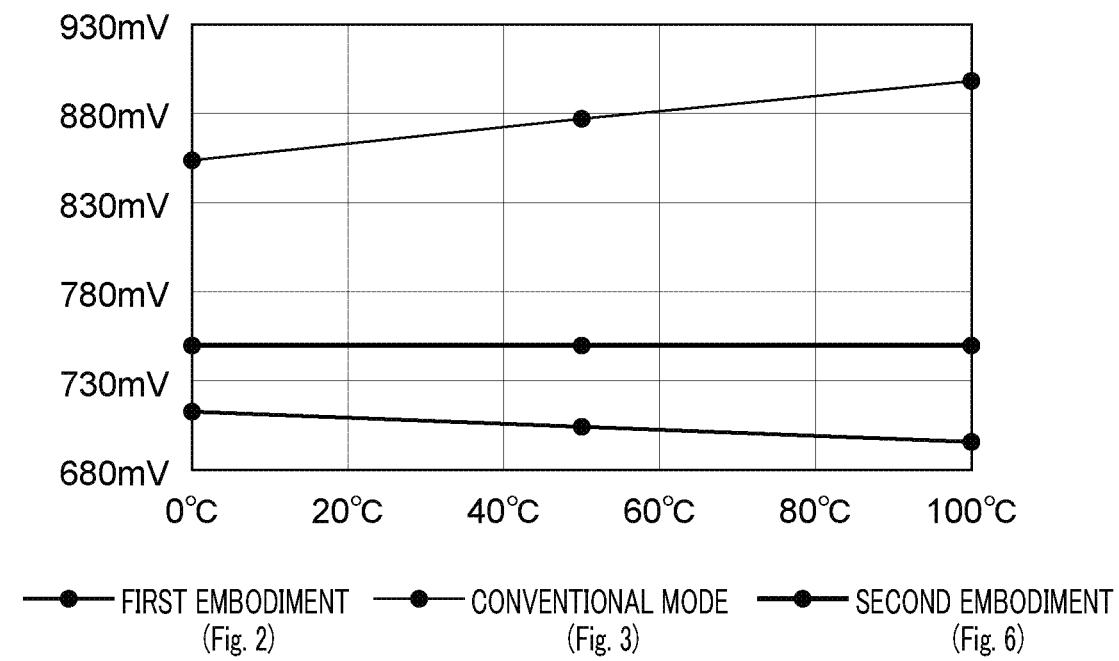
FIG. 7 is a table showing simulation results of the second embodiment.
FIG. 8 is a graph showing the simulation results of the second embodiment.

The results of the simulation are shown in FIG. 7 and FIG. 8. FIG. 7 is a table showing simulation results of the second embodiment. FIG. 8 is a graph showing the simulation results of the second embodiment.

FIG. 7 and FIG. 8 show the voltage value of the output terminal 50C of the differential amplifier circuit 50 and the ideal voltage value of the output terminal 50C of the differential amplifier circuit 50 in the voltage detection device 10 illustrated in FIG. 6 for each temperature of 0° C., 50° C., and 100° C. In FIG. 7 and FIG. 8, the voltage value of the voltage detection device 10 (voltage detection device 10 according to the first embodiment of the present invention) illustrated in FIG. 2 and the voltage value of the voltage detection device 10 (voltage detection device 100 according to the conventional mode) illustrated in FIG. 3 are shown for each temperature of 0° C., 50° C., and 100° C.

As described in the simulation of the first embodiment, the ideal voltage value is 750 mV regardless of the temperature (see FIG. 4 and FIG. 5).

As shown in FIG. 7 and FIG. 8, in the voltage detection device 100 (voltage detection device 100 according to the conventional mode) illustrated in FIG. 3, the voltage value of the output terminal 50C of the differential amplifier circuit 50 is 854 mV when the temperature is 0° C., 878 mV when the temperature is 50° C., and 899 mV when the temperature is 100° C.

In the voltage detection device 100 according to the conventional mode, the rate of change in the voltage value of the output terminal 50C of the differential amplifier circuit 50 when the temperature changes from 0° C. to 100° C. is approximately 1.053.

In the voltage detection device 100 according to the conventional mode, the difference between the voltage value of the output terminal 50C of the differential amplifier circuit 50 and the ideal voltage value is 104 mV to 149 mV.

In addition, in the voltage detection device 10 (voltage detection device 10 according to the first embodiment of the present invention) illustrated in FIG. 2, the voltage value of the output terminal 50C of the differential amplifier circuit 50 is 713 mV when the temperature is 0° C., 705 mV when the temperature is 50° C., and 697 mV when the temperature is 100° C.

In the voltage detection device 10 according to the first embodiment, the rate of change in the voltage value of the output terminal 50C of the differential amplifier circuit 50 when the temperature changes from 0° C. to 100° C. is approximately 0.978.

In the voltage detection device 10 according to the first embodiment, the difference between the voltage value of the output terminal 50C of the differential amplifier circuit 50 and the ideal voltage value is 37 mV to 53 mV.

On the other hand, in the voltage detection device 10 (voltage detection device 10 according to the second embodiment) illustrated in FIG. 6, the voltage value of the output terminal 50C of the differential amplifier circuit 50 is 749.8 mV regardless of the temperature. All of these voltage values are lower than the ideal voltage value of 750 mV.

In the voltage detection device 10 according to the second embodiment, the voltage value of the output terminal 50C of the differential amplifier circuit 50 is the same regardless of the temperature. That is, in this simulation, the rate of change in the voltage value of the output terminal 50C of the differential amplifier circuit 50 in the voltage detection device 10 according to the second embodiment is 1, similarly to the rate of change in the ideal voltage value. That is, the rate of change in the voltage value in the voltage detection device 10 according to the second embodiment is closer to the rate of change in the ideal voltage value than the rate of change in the voltage value in the voltage detection device 100 according to the conventional mode (approximately 1.053) and the rate of change in the voltage value in the voltage detection device 10 according to the first embodiment (approximately 0.978).

In the voltage detection device 10 according to the second embodiment, the difference between the voltage value of the output terminal 50C of the differential amplifier circuit 50 and the ideal voltage value is 0.2 mV, which is smaller than the difference (104 mV to 149 mV) in the voltage detection device 100 according to the conventional mode and the difference (37 mV to 53 mV) in the voltage detection device 10 according to the first embodiment.

According to the second embodiment, the wiring portions 31 to 34 and 41 to 44 extend from all the resistance elements R1 to R4 of the resistance unit 20. In the second embodiment, it is possible to detect a voltage in which the influence of the configuration of the wiring pattern of the resistance unit 20 and the temperature is suppressed to be lower than in a configuration in which the wiring portion extends from some resistance elements in the resistance unit 20.

Third Embodiment

Figure 9:
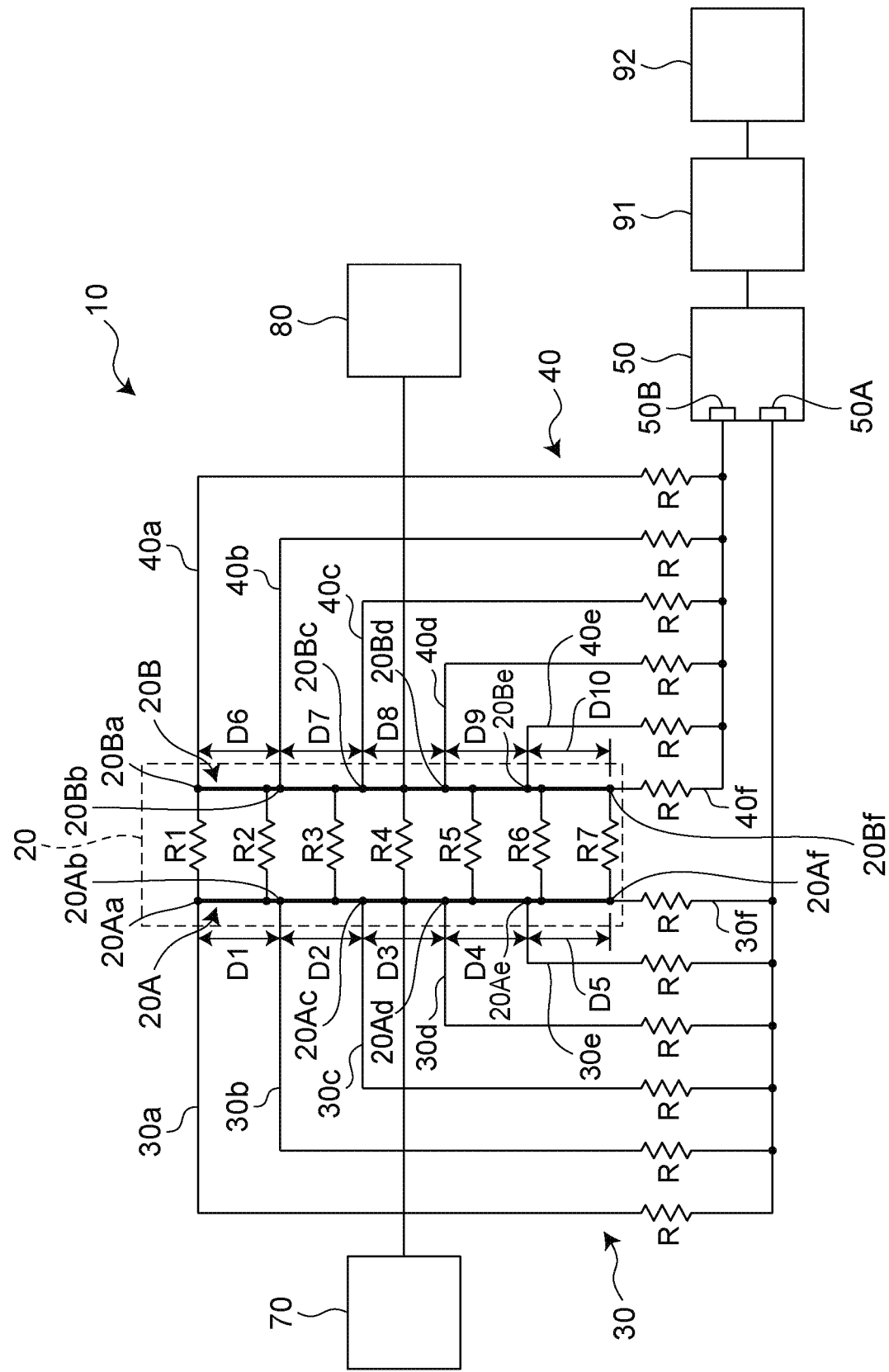
FIG. 9 is a circuit diagram of a voltage detection device according to a third embodiment of the present invention.

FIG. 9 is a circuit diagram of a voltage detection device according to a third embodiment of the present invention. The voltage detection device 10 according to the third embodiment is different from the voltage detection device 10 according to the first embodiment in the following two points. The first difference is that one ends of some wiring portions among the plurality of wiring portions of the first connection portion 30 are connected to portions other than the resistance elements of the resistance unit 20, and the other ends of some wiring portions among the plurality of wiring portions of the second connection portion 40 are connected to portions other than the resistance elements of the resistance unit 20. The second difference is that one end portions of the plurality of wiring portions of the first connection portion 30 are located at equal intervals in the extending direction of the one end portion 20A of the resistance unit 20, and one end portions of the plurality of wiring portions of the second connection portion 40 are located at equal intervals in the extending direction of the other end portion 20B of the resistance unit 20.

As illustrated in FIG. 9, the first connection portion 30 includes six wiring portions 30*a* to 30*f*, and the second connection portion 40 includes six wiring portions 40*a* to 40*f*.

One end portion of the wiring portion 30*a* is connected to a first position 20Aa in the one end portion 20A of the resistance unit 20. One end portion of the wiring portion 30*b* is connected to a second position 20Ab in the one end portion 20A of the resistance unit 20. One end portion of the wiring portion 30*c* is connected to a third position 20Ac in the one end portion 20A of the resistance unit 20. One end portion of the wiring portion 30*d* is connected to a fourth position 20Ad in the one end portion 20A of the resistance unit 20. One end portion of the wiring portion 30*e* is connected to a fifth position 20Ae in the one end portion 20A of the resistance unit 20. One end portion of the wiring portion 30*f* is connected to a sixth position 20Af in the one end portion 20A of the resistance unit 20. The first position 20Aa to the sixth position Af are examples of a plurality of positions of the first connection portion. The other end portion of each of the wiring portions 30*a* to 30*f* is connected to the input terminal 50A of the differential amplifier circuit 50.

One end portion of the wiring portion 40*a* is connected to a seventh position 20Ba in the other end portion 20B of the resistance unit 20. One end portion of the wiring portion 40*b* is connected to an eighth position 20Bb in the other end portion 20B of the resistance unit 20. One end portion of the wiring portion 40*c* is connected to a ninth position 20Bc in the other end portion 20B of the resistance unit 20. One end portion of the wiring portion 40*d* is connected to a tenth position 20Bd in the other end portion 20B of the resistance unit 20. One end portion of the wiring portion 40*e* is connected to an eleventh position 20Be in the other end portion 20B of the resistance unit 20. One end portion of the wiring portion 40*f* is connected to a twelfth position 20Bf in the other end portion 20B of the resistance unit 20. The seventh position 20Ba to the twelfth position Bf are examples of positions of the second connection portion. The other end portion of each of the wiring portions 40*a* to 40*f* is connected to the input terminal 50B of the differential amplifier circuit 50.

Similarly, to the first embodiment and the second embodiment, the resistance element R is disposed in each of the wiring portions 30*a* to 30*f* and 40*a* to 40*f*. In the third embodiment, the resistance value of each resistance element R is 1Ω.

One ends of the resistance elements R1 to R7 are connected in a state of being aligned in the extending direction at the one end portion 20A of the resistance unit 20. In addition, the other ends of the resistance elements R1 to R7 are connected in a state of being aligned in the extending direction at the other end portion 20B of the resistance unit 20. That is, the one end portion 20A of the resistance unit 20 extends along the extending direction, and the other end portion 20B of the resistance unit 20 extends along the extending direction. The extending direction is a direction in which the pattern wiring constituting the one end portion 20A and the other end portion 20B of the resistance unit 20 extends. The extending direction of the one end portion 20A of the resistance unit 20 is an example of a first direction. The extending direction of the other end portion 20B of the resistance unit 20 is an example of a second direction. In the third embodiment, both the extending direction of the one end portion 20A of the resistance unit 20 and the extending direction of the other end portion 20B of the resistance unit 20 are the vertical direction in the plane of drawing of FIG. 9, but the present invention is not limited thereto. For example, when the pattern wiring constituting the one end portion 20A of the resistance unit 20 is bent, the extending direction of the one end portion 20A of the resistance unit 20 is also a bent direction. In FIG. 9, the extending direction of the one end portion 20A of the resistance unit 20 and the extending direction of the other end portion 20B of the resistance unit 20 are the same direction but may be different directions.

The first position 20Aa to the sixth position 20Af are located at equal intervals in the extending direction of the one end portion 20A of the resistance unit 20. Specifically, in the extending direction of the one end portion 20A of the resistance unit 20, a distance D1 between the first position 20Aa and the second position 20Ab, a distance D2 between the second position 20Ab and the third position 20Ac, a distance D3 between the third position 20Ac and the fourth position 20Ad, a distance D4 between the fourth position 20Ad and the fifth position 20Ae, and a distance D5 between the fifth position 20Ae and the sixth position 20Af are equal distances.

The seventh position 20Ba to the twelfth position 20Bf are located at equal intervals in the extending direction of the other end portion 20B of the resistance unit 20. Specifically, in the extending direction of the other end portion 20B of the resistance unit 20, a distance D6 between the seventh position 20Ba and the eighth position 20Bb, a distance D7 between the eighth position 20Bb and the ninth position 20Bc, a distance D8 between the ninth position 20Bc and the tenth position 20Bd, a distance D9 between the tenth position 20Bd and the eleventh position 20Be, and a distance D10 between the eleventh position 20Be and the twelfth position 20Bf are equal distances.

In FIG. 9, the first position Aa is located at one end of the resistance element R1, and the sixth position Af is located at one end of the resistance element R7. On the other hand, the second position Ab to the fifth position Ae are not located at one end of the resistance element. The second position Ab to the fifth position Ae are located between two adjacent resistance elements at the one end portion 20A of the resistance unit 20.

Note that the first position 20Aa to the sixth position Af are not limited to the above positions on the condition that the distances D1 to D5 are equal distances. For example, all of the first position 20Aa to the sixth position Af may be located between two adjacent resistance elements in the one end portion 20A of the resistance unit 20 instead of the one end of the resistance element.

In FIG. 9, the seventh position Ba is located at the other end of the resistance element R1, and the twelfth position Bf is located at the other end of the resistance element R7. On the other hand, the eighth position Bb to the eleventh position Be are not located at the other end of the resistance element. The eighth position Bb to the eleventh position Be are located between two adjacent resistance elements at the other end portion 20B of the resistance unit 20.

Similarly, to the first position 20Aa to the sixth position 20Af, the seventh position 20Ba to the twelfth position Bf are not limited to the above positions on the condition that the distances D6 to D10 are equal distances.

According to the third embodiment, similarly to the first embodiment and the second embodiment, the one end portion 20A and the other end portion 20B of the resistance unit 20 are connected to the differential amplifier circuit 50 by the plurality of wirings. As a result, it is possible to detect a voltage in which the influence of the configuration of the wiring pattern of the resistance unit 20 and the temperature is suppressed to be low.

Note that, by appropriately combining any embodiments among the various embodiments described above, the effects of the respective embodiments can be achieved.

Although the present invention has been sufficiently described in connection with preferred embodiments with reference to the drawings appropriately, various modifications and corrections are apparent to those skilled in the art. Such modifications and corrections are to be understood as being included within the scope of the present invention as set forth in the appended claims as long as they do not depart therefrom.

DESCRIPTION OF SYMBOLS 20 resistance unit
20A one end portion
30 first connection portion
31-36 wiring portion
40 second connection portion
41-46 wiring portion
50 differential amplifier circuit
50A input terminal
50B input terminal
R1-R7 resistance element
R31-R36 resistance element
R41-R46 resistance element

What is claimed is:

1. A voltage detection device comprising:
a resistance unit comprising a plurality of resistance elements connected in parallel;
a differential amplifier circuit;
a first connection portion that connects a plurality of positions different from each other in one end portion of the resistance unit and a first input terminal of the differential amplifier circuit; and
a second connection portion that connects a plurality of positions different from each other in the other end portion of the resistance unit and a second input terminal of the differential amplifier circuit,
wherein the voltage detection device configures to detect a voltage applied to the resistance unit based on a voltage of an output terminal of the differential amplifier circuit,
wherein one ends of the plurality of resistance elements are connected in a state of being aligned in a first direction at the one end portion of the resistance unit,
a plurality of positions of the first connection portion are located at equal intervals in the first direction,
the other ends of the plurality of resistance elements are connected in a state of being aligned in a second direction at the other end portion of the resistance unit, and
a plurality of positions of the second connection portion are located at equal intervals in the second direction.

2. The voltage detection device of claim 1, wherein the first connection portion comprises:
a first wiring portion that connects one end of a first resistance element, which is one of the first resistance element and a second resistance element located at positions farthest from each other among the plurality of resistance elements of the resistance unit, and the first input terminal; and
a second wiring portion that connects one end of the second resistance element and the first input terminal, and
the second connection portion comprises:
a third wiring portion that connects the other end of the first resistance element and the second input terminal; and
a fourth wiring portion connecting the other end of the second resistance element and the second input terminal.

3. The voltage detection device of claim 1, wherein the first connection portion connects one end of each of the plurality of resistance elements and the first input terminal, and
the second connection portion connects the other end of each of the plurality of resistance elements and the second input terminal.

* * * * *